(12) United States Patent
Hui et al.

(10) Patent No.: US 8,430,521 B2
(45) Date of Patent: Apr. 30, 2013

(54) POOL LIGHTING ASSEMBLY

(75) Inventors: Wing-kin Hui, Hong Kong (HK);
Wing-tak Hui, Hong Kong (HK)

(73) Assignee: Jet Motor Limited, Kwun Tong (HK)

( * ) Notice: Subject to any disclaimer, the term of this patent is extended or adjusted under 35 U.S.C. 154(b) by 66 days.

(21) Appl. No.: 13/175,849

(22) Filed: Jul. 2, 2011

(65) Prior Publication Data

US 2013/0003356 A1    Jan. 3, 2013

(51) Int. Cl.
*F21V 33/00* (2006.01)
(52) U.S. Cl.
USPC ............ 362/101; 362/373; 362/294; 362/264
(58) Field of Classification Search .................. 362/373, 362/294, 264, 149, 101
See application file for complete search history.

(56) References Cited

U.S. PATENT DOCUMENTS

| | | | |
|---|---|---|---|
| 6,702,451 B1 * | 3/2004 | Daane | 362/96 |
| 7,303,301 B2 * | 12/2007 | Koren et al. | 362/101 |
| 2003/0147238 A1 * | 8/2003 | Allen et al. | 362/192 |
| 2007/0139913 A1 * | 6/2007 | Savage | 362/101 |
| 2008/0205034 A1 * | 8/2008 | Kunkel et al. | 362/101 |

* cited by examiner

*Primary Examiner* — Julie Shallenberger
(74) *Attorney, Agent, or Firm* — Peninsula IP Group; Douglas Chaikin

(57) ABSTRACT

Disclosed herein is a pool light assembly having structure for providing cooling to pools having illumination elements. The light assembly includes a sub-assembly having one or more light elements, preferably high output LED elements. Additionally, the light assembly has a water channel. The LED sub-assembly is located proximate the water channel. In the several embodiments shown, the structure of a typical light assembly has been modified such that the distance between the LED sub-assembly and the water channel is minimized.

5 Claims, 3 Drawing Sheets

POOL LIGHTING ASSEMBLY

RELATED APPLICATIONS

This application is related to application Ser. No. 12/854,170, filed by co-inventor, Wing-kin HUI, for A POOL LIGHT ASSEMBLY, filed on Aug. 11, 2010 and also, application Ser. No. 13/013,459 filed by the same inventive entity on Jan. 25, 2011. These applications are specifically incorporated herein and are to be used for any and all purposes consistent with incorporation by reference.

FIELD OF THE INVENTION

This invention relates generally to the field of pool equipment, either above or in-ground pools. More particularly, this invention relates to pool fixtures designed for adapting a pool light assembly to a pool. Most particularly, this invention relates to the field of such devices, which offer pool illumination plus cooling of the illumination device and surrounding structure.

BACKGROUND OF THE INVENTION

There has been a recent increase in the popularity of pool lighting. While, pool lighting has been around for many years, new fixtures allow for greater creativity and expanded use both for swimming and non-swimming events. Pool lighting can be used to make an attractive back yard look outstanding.

Many of the issues associated with such lighting have not been fully appreciated. For example, some illumination devices, especially in the beginning, used lighting elements that would get extremely hot and cause rapid deterioration of the entire lighting assembly. Such heat would lead to increased maintenance by the pool owner and constant replacing of not only the light assembly unit, but also the entire inlet housing. Sometimes a pool would need to be drained just to do the necessary maintenance.

Despite these and other issues, pool lighting has become increasingly popular. Initially pool lighting was used strictly for safety purposes. Nighttime swimming, although not terribly popular, was done with much greater safety at night with lighted pools for obvious reasons.

After adding lighting, perhaps initially for safety reasons, pool owners and visitors, and others noticed the calming effort of nighttime lighting on the pool water. Visitors and pool owners alike noticed the tranquil effect sitting by the pool at night had with such lighting.

The increased popularity led to additional enhancements. For example, color lighting has frequently been added to create nighttime pool water as a home's water feature. Such lighting provided viewers with greater interest and had the same or greater benefits to peaceful and tranquil viewing. Additional enhancements such as sequential color lighting have also been added.

While, the above and other enhancements have clearly made lighting swimming pools, more desirable and even more readily available, none of the above has focused on the issue of heat dissipation. For example, halogen lighting has commonly been used until quite recently. However, the energy demands for such lighting have prompted government officials to discourage and even ban their usage. Today, high and ultra high intensity LED's are the main source of pool illumination lighting elements. These heating elements give off a tremendous amount of heat individually and exponentially additional heat when combined in series such as that favored in colored pool illumination systems.

Additionally, many of today's pool illumination systems use a reflector or reflector plate. This increases the focus and intensity of the lighting for greater and more desirable effects. However, as can be appreciated, such a reflector does not relieve, but rather increases the amount of heat in the illumination system.

What is needed is a structure for allowing a pool lighting installation to be cooled without resorting to undue structure or expensive maintenance. The ideal structure would conform in general physical appearance and dimensions of existing pool water inlets or returns, while providing cooling to the needed structure of the illumination structure.

SUMMARY OF THE INVENTION

The structure of the improved pool light assembly with cooling structure in accordance with the present invention includes using the existing pool inlet or return and locating the placement of the lighting elements, namely the LED in close proximity to the water channel. In point of fact, the general purpose of the invention is to minimize the distance between the water channel and the LED assembly containing the lighting elements or LEDs.

It is known that the LEDs give off a high level of heat. It is also know that while water is flowing through the water channel, water channel acts as a cooling source. It is not always appreciated that water merely present in the water channel also acts as a cooling source. Certainly, relative to the high heat of high output LEDs and other similar lighting elements, even still water in the water channel provides a cooling source.

In typical operations, manufacturers of high output LEDs, such as CREE recommend creating a metal pad on the circuit board where LED resides. Typically, the metal pad is made copper foil, typical in the printed circuit board (CREE XLamp XR-E LED Data Sheet 2006-2007). Unfortunately, the copper foil is very thin, typically 0.002" thick and therefore the amount of heat that can be transferred is limited. In any case there are drawbacks to transferring the heat through the printed circuit board because the board, itself is not a good thermal conductor.

As a result of the inventive recognition that a cooling source provides greater and more effective means of prolonging and maintaining lighting element life, the inventive structure here is a departure in the opposite direction from the norm. In this invention, the structure herein provides for minimizing the distance between heat source and cooling source. This means eliminating as much of the insulation layers as possible. Thus, instead of providing thick insulation layers, the structure herein provides for thin as possible layers and includes embodiments having structure to further minimize such distance between the cooling and heating sources.

It is an object of this invention is to provide a pool light assembly, which uses pool water to cool the assembly.

It is another object of this invention to provide a pool light assembly, which includes the basic existing light assembly and allows modifications to both improve reliability of the assembly and allow the latest illumination elements to be used.

In accordance with the objects set forth above and as will be described more fully below, the pool light assembly in accordance with this invention, comprises:

A pool light assembly for use in connection with swimming pools having a water channel, the pool light assembly comprising:

a substrate located proximate to the water channel, the substrate defining a structure for mounting a light assembly upon;

the light assembly including an LED assembly mounted on the substrate;

the water channel adapted for allowing water to flow therethrough and having hollow walls wherein the substrate is located, upon water flowing the water channel defining a cooling source; and the LED assembly mounted on the substrate so as to minimize the distance between LED assembly and the cooling source, whereby the water channel acts as a cooling source for the LED assembly.

In one particular exemplary embodiment, the pool light assembly for use in connection with swimming pools having a water channel, the pool light assembly comprises:

a substrate located proximate to the water channel, the substrate defining a structure for mounting a light assembly upon;

the light assembly including an LED assembly and the LED assembly having a housing and the LED assembly having a housing and the LED assembly mounted on the substrate;

means for mounting the LED assembly on the substrate;

the water channel adapted for allowing water to flow therethrough and having hollow walls wherein the substrate is located, upon water flowing the water channel defining a cooling source; and the substrate having an opening and the LED assembly mounted on the substrate such that a portion of the LED assembly housing extends through the opening, so as to minimize the distance between LED assembly and the cooling source, whereby the water channel acts as a cooling source for the LED assembly.

In another exemplary embodiment, the pool light assembly comprises:

a first substrate located proximate to the water channel, the substrate defining a structure for mounting a light assembly upon;

a second substrate proximate to the water channel, the second substrate located between the first substrate and the water channel;

the light assembly including an LED assembly and the LED assembly having a housing and the LED assembly having a housing and the LED assembly mounted on the substrate;

means for mounting the LED assembly on the first substrate;

the water channel adapted for allowing water to flow therethrough and having hollow walls wherein the substrate is located, upon water flowing the water channel defining a cooling source; and the first substrate having an opening and the LED assembly mounted on the substrate such that a portion of the LED assembly housing extends through the opening, so as to minimize the distance between LED assembly and the cooling source, the second substrate defining an insulation member, whereby the water channel acts as a cooling source for the LED assembly and the second substrate acts as an insulation layer.

Of course, various other exemplary embodiments are possible to achieve various objects of the invention within the spirit and scope of this invention.

It is an advantage of the pool light assembly of this invention to provide a structure that uses pool water to cool the heat generated by high intensity lighting elements.

It is an additional advantage of the pool light assembly in accordance with the instant invention to provide to both above and in-ground pools with such a lighting assembly having cooling structure.

It is an additional advantage of the pool light assembly in accordance with the instant invention to provide to new and existing pool structures with such a lighting assembly having cooling structure.

BRIEF DESCRIPTION OF THE DRAWING

For a further understanding of the objects and advantages of the present invention, reference should be had to the following detailed description, taken in conjunction with the accompanying drawing, in which like parts are given like reference numerals and wherein.

DETAILED DESCRIPTION OF THE INVENTION

In order to appreciate the invention herein, one must appreciate the need in the art as set forth in the Background. Most importantly, the structure herein for resolving the long felt need to dissipate heat from a high output LED. The structure of this invention takes advantage of the fact that the high output LED is located in proximity of a water source. The ability to recognize that this water source has the potential to serve as cooling source for the LED and the adaptation of the structure of a pool light assembly comprise the essence of the invention.

In order to appreciate the structure of the invention, a general pool light assembly of the type that is easily adapted to inventive structure will first be described with respect to FIG. 1. This structure was first described in related application Ser. No. 13/013,459 filed by the same inventive entity on Jan. 25, 2011, under the title of A Pool Light Assembly.

Figure 1:
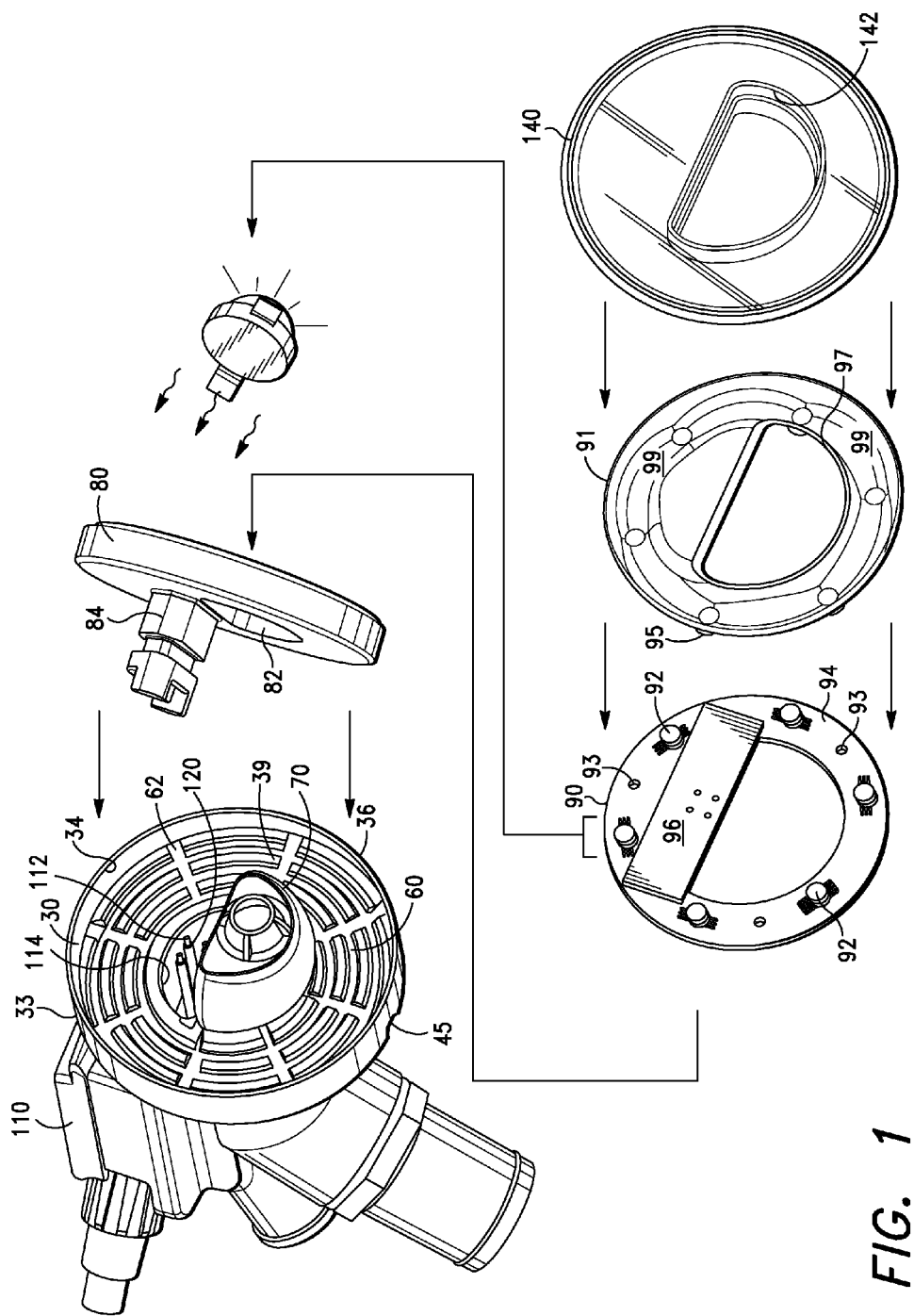
FIG. 1 is a cross sectional view of the pool water return inlet which includes a power supply head and the pool light assembly in accordance with a related invention.

With particular reference to FIG. 1, there is shown an exemplary embodiment of a pool return 100. The pool return 100 includes a power supply head 110 and the pool light assembly, generally denoted by the numeral 20. The pool return 100 includes a water inlet 102, which leads to a water channel 104.

As shown in FIG. 1, the pool light assembly 20 includes a water inlet housing 30. The housing 30 has a central opening 31 defining the water channel 104. The power supply head 110 mates with the housing 30, as shown particularly clearly in FIG. 1. The power supply head 110 has an electrical channel 112 and is shown in FIG. 1 with electrical wires 114 extending to an electrical source (not shown) such as an electrical outlet (also, not shown). The power supply head 110 distributes power to the light assembly 20 through electrical conduit shown clearly in FIG. 1.

The light assembly housing 30 has an exterior 32. As shown in FIG. 1, the housing 30 is mounted on a pool wall 50. The housing 30 has a first portion 40 located on the dry side of the mounting and a second portion 42 immersed in pool water. In the embodiment shown in FIG. 1, two washers 33 on the poolside and a tightening nut 35 on the dry side form a watertight seal around the opening in the pool where the housing 20 is inserted.

The second portion 42 of the housing 30 includes a flange member 36. The interior 36 has a central opening 38 allowing water to pass therethrough and communicate with the water channel 104 through inlet 102. The interior 36 defines a base 39 for the light assembly 20.

The flange member 36 sits, during operation, immersed in pool water. At least one notch 45 is provided in the exterior 32 of the flange member 36 extending into the interior 34. Thus, constructed, the notch 45 that allows pool water to communicate freely between the interior 34 and exterior 32 and throughout the flange member base 39.

The interior 36 includes a raised pattern of ribs 60 and dividers 62. The ribs 60 and dividers 62 can, of course, be made to have any particular pattern within the spirit and scope of the invention. For example, the pattern may well be non-symmetrical or zigzagged within the spirit and scope of the invention herein. The functional requirement for such a pattern is to ensure that water flows freely through the base 39 to provide a cooling effect for the light sub-assembly as described below.

In the embodiment shown in FIG. 1, the base has two notches 45. It will be appreciated that only one such notch is required. However, two notches have been found to facilitate the flow of water through the base 39, which, of course, aids in the cooling of the light assembly. While, more notches are within the spirit and scope of the invention, such have not been found to greatly aid the cooling effect of pool water through the base and therefore, the best mode of carrying out the invention has to date been found by using the two notch embodiment illustrated by the drawing herein.

A sealing plate 80 covers and seals the base 39 when the light assembly is fully assembly as will be more fully appreciated below. The sealing plate 80 has a central opening 82 for allowing pool water to enter the water channel 104 and for maintaining open communication with pool water and the pool return 100.

A light sub-assembly 90 fits within the outer periphery of the sealing member 80. The light sub-assembly 90 includes a plurality of LED's 92 on a circuit board 94 in the shape of ring. The circuit board 94 includes a plug-in connector 96. As shown, the plug-in connector is sized and shaped for a mating force fit with the electrical wiring as shown. The LED's 92 obtain electrical power for the electrical power head 110 through the wiring 112.

A retaining member 91 is designed to snap fit over the light sub-assembly 90. In the embodiment shown, the light sub-assembly 90 includes posts 93 and the retaining member has female projections 95, which create a secure snap, fit there between. Additionally, the retaining member 91 has a central opening 97 for allow water to pass therethrough to the water channel 104. Additionally, the lighting elements, regardless of type, typically project from the light sub-assembly 90. Therefore, the retaining member 91 has a series of matching opening for allowing the LED's 92 to pass therethrough. Once assembled the retaining member 91 snap fits to the light sub assembly 90 providing a secure assembly for the entire light assembly 20.

A lens cover 140 is provided to cover retaining member 91. Similarly, the lens cover 140 has a central opening 142 allowing communication of the pool water into the water channel 104. The lens cover 140 has periphery with a groove and as is known in the art snap fits into the outer periphery of the retaining member 91. The fit is secure to discourage any water from entering into the light assembly 20 except, of course, through the central opening 142.

As can be appreciated by those skilled in the art, the retaining member 91 in a preferred embodiment includes a reflective surface 99 surrounding the projecting lighting elements 92. Thus, structured, the retaining member 91 thereby defines a reflector plate.

Such a reflector plate is particular useful and desirable when colored lighting elements are used. As is known in the art the lighting elements may be of different colors by adapter different lighting element covers over the LEDS. Additionally, the lens cover 140 may be of different colors, having different color segments and shapes to provide more enhanced pool lighting.

As shown, the water channel 104 extends through the body of light assembly 20. The central openings in each of the above elements are aligned so as to create a single water channel 104.

The source of the intense heat in the light assembly 20 is the lighting elements 92. The heat from these LED's 92 can be quite extreme. In an effort to cool the source of the heat, it is advantageous to locate the cooling source as close to the heating source as possible. However, this must been without compromising the electrical integrity of the light assembly 20 as a whole and without resorting to structures and devices which will not work within conventional structure already established in the art.

Figure 2:
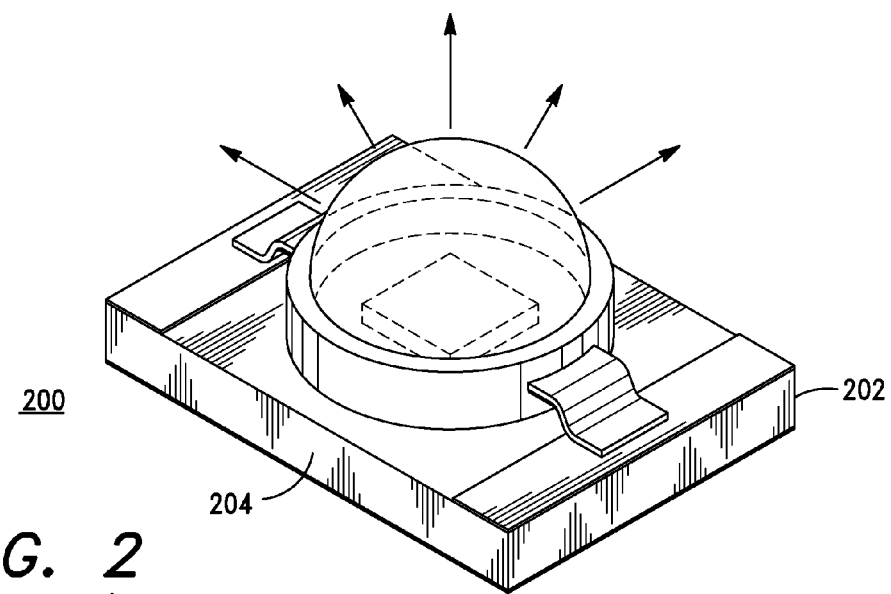
FIG. 2 illustrates a prior art structure for mounting an LED assembly in a pool light assembly.

With particular reference to FIG. 2, there is shown a prior art structure for mounting an LED 200 on an LED sub-assembly 202. The LED sub-assembly 202 includes a substrate 204. Pursuant to manufacturer's suggestions the substrate is a dielectric material. For example, CREE, a leading manufacturer of such high output LED's recommends such mounting material in their manuals. Moreover, substrate 204 is not thermally conductive. Therefore, the amount of heat transferred compared the structure of the present invention, is remarkably small.

The LED includes a housing 201 mounted on electrically conductive material 203. The electrically conductive material 203 is mounted on the substrate 204. The electrically conductive material is made from typically al or copper and is usually cladding of the sort ordinary in the art.

The LED's 200 are mounted on the substrate 204 in a manner already know in the art. Mounting members 206 mount the LED's 200 on the sub-assembly 202 as shown in FIG. 2.

Figure 3:
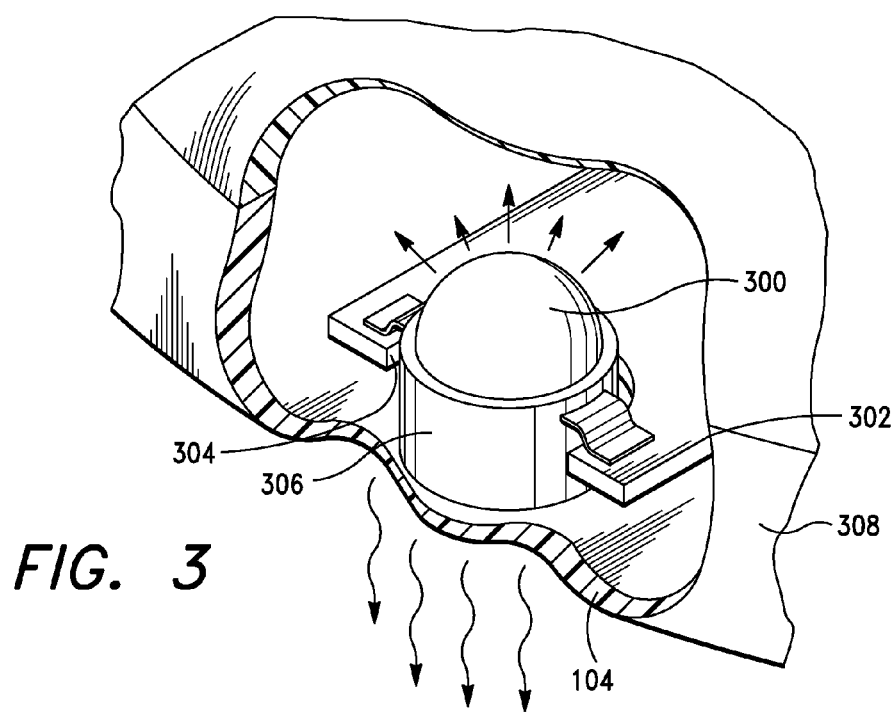
FIG. 3 illustrates an exemplary embodiment of the LED assembly mounted in close proximity to the water channel in a pool light assembly in accordance with this invention, shown in perspective.

With respect to FIG. 3, there is shown the first embodiment of the invention, the high output LED 300, mounted on a substrate 302. In this embodiment the substrate 302 is ultra thin. In this embodiment, the substrate 302 includes an opening 304 through the LED 300 is inserted.

The LED 300 has a housing 306. The housing 306 has a circumference, which is sized and shaped to fit compatibly within the opening 304. In the example shown in FIG. 3, the opening is round and therefore, consistent with the shape of the opening, the circumference of the housing 306 is likewise round.

Similarly, the circumference of the housing 306 is sized for snug compatible fit with the opening 304. Thus, the circumference is sized to be approximately equal to the inside diameter of the opening 304 for a snug fit.

As shown in FIG. 3, the LED sub-assembly including LED 300, fits into the interior portion of the channel wall 308 of the water channel 104. As shown in FIG. 1, water flows through the water channel 104. The temperature of the water is certainly less than the temperature of the LED 300 in operation. Therefore, the interior portion of the channel wall 308 is cooled as water is present in the water, even on the hottest of days.

For example the water in the channel while fresh water is flowing through the water channel 104 is well below 55 degrees F. This has the effect of acting as a cooling source for anything proximate to the water channel 104. Thus, the interior wall portion of the water channel, where the LED sub-assembly resides, is likewise cooled by the water flowing through the water channel 104.

Here, the LED 300 is mounted on the substrate 302 in such a way, so as to minimize the distance between itself and the cooling source, namely, the water channel 104. By inserting the housing 306 through the opening 304, the LED is thus closer to the cooling source.

Additionally, the substrate 302 is made from an insulating material to dissipate the heat form the LED 300 while in operation. There is sufficient heat dissipation from the substrate to not cause the interior wall of the water channel to burn, even if no water is present in the water channel. That is, at least for short durations of operation of the LED.

Figure 4:
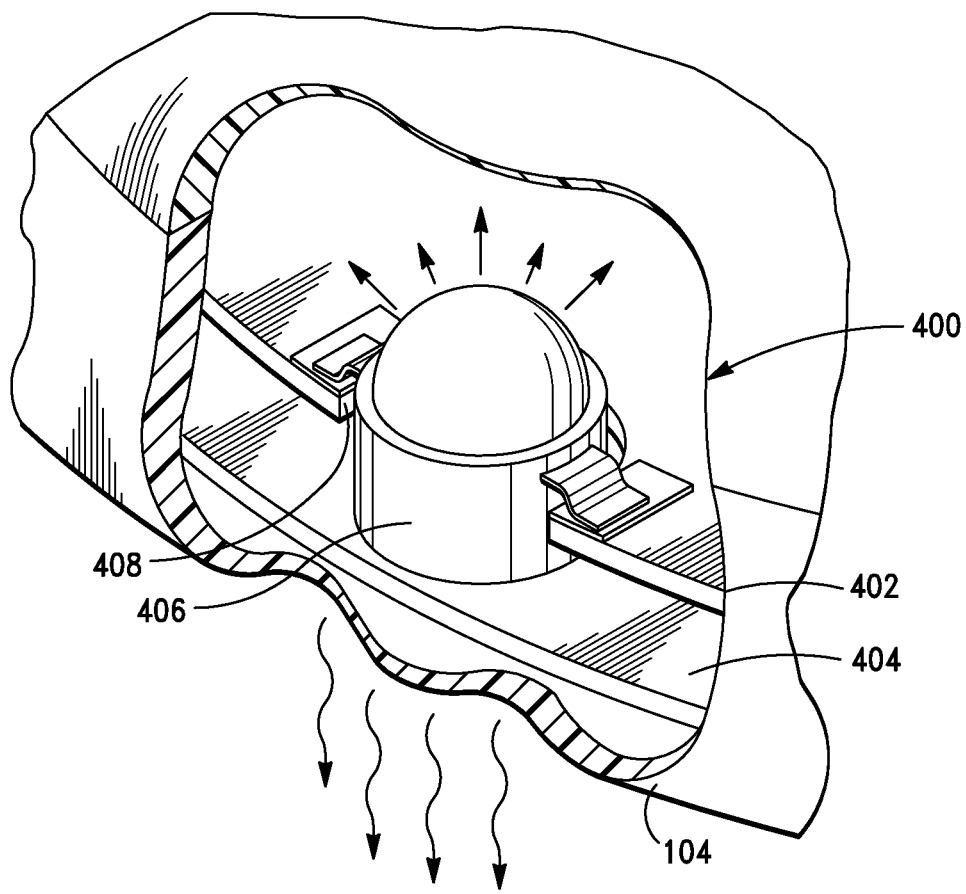
FIG. 4 illustrates another embodiment of an exemplary embodiment of the structure for mounting an LED assembly on the pool light assembly in accordance with this invention, shown in perspective.

With respect to FIG. 4, there shown another exemplary embodiment of the LED assembly in accordance with the invention, generally designated by the numeral 400. The LED sub-assembly 400 includes a first substrate 402 and a second substrate 404. The LED sub-assembly 400 has a housing 406. Like the exemplary embodiment shown in FIG. 3, the housing 406 is inserted through an opening 408 in the first substrate 302. Similarly to the embodiment shown in FIG. 3, the LED 400 embodiment of FIG. 4, includes housing 406 sized and shaped to fit snugly through the opening 408.

The second substrate 404 is located between the first substrate 402 and the water channel 102 as shown clearly in FIG. 4. The housing 406 is inserted partially through the opening 408 until it rests upon the second substrate 404.

As the earlier described embodiment, each substrate layer 402 and 404 are made as thinly as possible. For example, the first substrate layer 402 is as thin as possible while being strong enough to support the LED associated with the LED sub assembly 400. The second substrate layer 404 is likewise as thin as possible to allow the maximum beneficial effects from the cooling source to reach the LED.

And, similar to the embodiment in FIG. 3, every effort is made to minimize the distance between the cooling source and the heating source, namely the LED 400. The LED housing 406 is inserted through the opening in the direction of the water channel, thereby minimizing the distance between the heating source, namely the LED 40 and the cooling source, namely, the water channel 102. While, the second layer of substrate 404, provides a barrier between the LED housing 406 and the water channel 102, the substrate is as thin as possible to minimize the loss of any cooling.

And, similar to the embodiment in FIG. 3, each of the substrate layers is made from an insulating material to dissipate the heat form the LED 400 while in operation. By providing substrate layers of insulating material, there is sufficient heat dissipation from the substrate layers to prevent the interior wall of the water channel from burning, even if no water is present in the water channel. That is, at least for short durations of operation of the LED.

Typically, dielectric or insulating materials used for the substrate are epoxy found on the pc boards themselves.

It will be appreciated that while the invention has been generally described with respect to a water channel, that such is not necessary to the basic inventive concept. Applicant herein trades insulation for thermal conductivity and allow a cooling source to cool the heating source or the high output LEDS. Considering the high level of heat produced by such high output LEDs, a cooling may well include ambient air. In that case, no water channel is need. Further, no channel of any kind is needed. However, the principle of mounting the high output LEDs on a thermally conductive substrate and minimizing the distance between cooling source and heating element remains the same.

While the foregoing detailed description has described several exemplary embodiments of the pool light assembly in accordance with this invention, it is to be understood that the above description is illustrative only and not limiting of the disclosed invention. Thus, the invention is to be limited only by the claims as set forth below.

What is claimed is:

1. A pool light assembly for use in connection with swimming pools having a water channel, the pool light assembly comprising:
   a first substrate located proximate to the water channel, the substrate defining a structure for mounting a light assembly upon;
   a second substrate proximate to the water channel, the second substrate located between the first substrate and the water channel;
   the light assembly including an LED assembly and the LED assembly having a housing and the LED assembly having a housing and the LED assembly mounted on the substrate;
   means for mounting the LED assembly on the first substrate;
   the water channel adapted for allowing water to flow therethrough and having hollow walls wherein the substrate is located, upon water flowing the water channel defining a cooling source; and
   the first substrate having an opening and the LED assembly mounted on the substrate such that a portion of the LED assembly housing extends through the opening, so as to minimize the distance between LED assembly and the cooling source, the second substrate defining an insulation member,
   whereby the water channel acts as a cooling source for the LED assembly and the second substrate acts as an insulation layer.

2. A pool light assembly as set forth in claim 1, wherein the second substrate defines a thin layer for minimizing the distance between the LED assembly and the cooling source, while providing an insulation layer.

3. A pool light assembly as set forth in claim 1, wherein the housing of the LED rests upon the second substrate.

4. A pool light assembly as set forth in claim 1, wherein each of the substrates is made from thermally conductive material.

5. A pool light assembly as set forth in claim 4, wherein each of the substrates is as thin as possible while performing its other functions.

\* \* \* \* \*